United States Patent
Teramoto et al.

(10) Patent No.: US 7,663,954 B2
(45) Date of Patent: Feb. 16, 2010

(54) SEMICONDUCTOR MEMORY DEVICE INCLUDING A SENSE AMPLIFIER HAVING A REDUCED OPERATING CURRENT

(75) Inventors: Kazuhiro Teramoto, Tokyo (JP); Yoji Idei, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 74 days.

(21) Appl. No.: 11/979,954

(22) Filed: Nov. 9, 2007

(65) Prior Publication Data

US 2008/0112244 A1 May 15, 2008

(30) Foreign Application Priority Data

Nov. 13, 2006 (JP) ............................. 2006-306144

(51) Int. Cl.
*G11C 7/00* (2006.01)
(52) U.S. Cl. .................. 365/205; 365/208; 365/189.05
(58) Field of Classification Search ................ 365/208, 365/205, 189.05

See application file for complete search history.

(56) References Cited

U.S. PATENT DOCUMENTS

| 5,724,292 A | * | 3/1998 | Wada .......................... 365/207 |
| 6,434,065 B1 | * | 8/2002 | Kobayashi et al. .......... 365/200 |

FOREIGN PATENT DOCUMENTS

| JP | 2000-251474 A | 9/2000 |
| JP | 2001-006364 | 1/2001 |
| JP | 11-073763 | 3/2008 |

* cited by examiner

*Primary Examiner*—Huan Hoang
(74) *Attorney, Agent, or Firm*—Foley & Lardner LLP

(57) ABSTRACT

A semiconductor memory device includes a shared transistor controlling coupling between a bit line pair in a memory cell array and a bit line pair in a sense amplifier. After a word line is activated and the sense amplifier amplifies the potential difference between the bit lines of the bit line pair in the sense amplifier, the shared transistor is tuned OFF and precharge/equalizing circuit is activated to precharge the bit lines in the sense amplifier to a potential which is half the internal power source potential.

23 Claims, 12 Drawing Sheets

US 7,663,954 B2

SEMICONDUCTOR MEMORY DEVICE INCLUDING A SENSE AMPLIFIER HAVING A REDUCED OPERATING CURRENT

This application is based upon and claims the benefit of priority from Japanese patent application No. 2006-306144, the disclosure of which is incorporated herein in its entirety by reference.

BACKGROUND OF THE INVENTION (a) Field of the Invention

The present invention relates to a semiconductor memory device including a sense amplifier which amplifies the potential difference between bit lines of a bit line pair.

(b) Description of the Related Art

In general, a semiconductor memory device includes an array of memory cells in a memory cell area. The memory cells each are connected to a pair of bit lines or bit line pair, and read/write operation of the data in the memory cells is performed via the bit line pair. During the a cycle, a memory cell outputs the read data to the bit line pair, whereby the potential of the bit line pair is changed based on the read data, i.e., depending "0" or "1" of the read data. A sense amplifier amplifies the potential difference between the bit line pair, to fix the potential of both the bit lines to a high level and a low level.

FIG. 16 shows a block diagram of the memory cell array in a conventional semiconductor memory device. In general, the semiconductor memory device includes a plurality of memory banks each including a plurality of memory cell mats (memory mats), two of which are shown in FIG. 16. Each memory mat includes a plurality of memory cells each located at the intersection between a bit line pair and a word line WL, which extend perpendicular to each other. The word line WL is controlled by a decoder XDEC to select a row of memory cells. When a word line WL is activated, a corresponding row of memory cells are selected and connected to respective bit line pairs, whereby data stored in the memory cells are delivered to the bit line pairs. The bit line pair includes a bit line BL and a bit line /BL, which configure complementary data lines.

A sense amplifier block including a plurality of sense amplifiers (SA) is used common to two memory mats in this example of a shared type. A shared transistor pair or transfer gate pair is interposed between the bit line pair in each sense amplifier and the bit line pair in each column of the memory mat, for controlling the coupling therebetween. In FIG. 16, for simplification of the drawing, only a single shared transistor SHR0 adjacent to memory mat MAT0 is illustrated while omitting the shared transistor adjacent to memory mat MAT1. In addition, in the description to follow, only the configuration or operation of a single column of the memory device will be described, since those of the other columns are similar. During a read/write operation, one of the shared transistors corresponding to a selected memory mat is turned ON, whereby the bit line pair BL in the sense amplifier is connected to the bit line pair in the activated memory mat.

FIG. 17 shows the circuit configuration of the sense amplifier block and the vicinity thereof. The sense amplifier includes two p-channel transistors and two n-channel transistors, and performs differential amplification of the potential difference between bit line BL and bit line /BL. Shared transistors SHR0 and SHR1 control the coupling between the bit line pair in the memory mats and the bit line pair in the sense amplifier. For example, if memory mat MAT0 is selected, shared transistor SHR0 is turned ON to couple the bit line pair in memory mat MAT0 and the bit line pair in the sense amplifier. A precharge/equaling circuit 201 precharges the bit line pair to have a potential level equal to half the power source potential, i.e., a VARY/2 voltage, while equalizing the potentials of the bit lines in the bit line pair.

The sense amplifier operates on the power source supplied through a power source line PCS which supplies a high-potential source voltage, and a power source line NCS which supplies a low-potential source voltage. During an active state of the sense amplifier, transistors FSAPT and FSAET are turned ON to receive source voltages VARY and VSSSA onto power source lines PCS and NCS, respectively. The sense amplifier performs differential amplification of the potential difference between the bit line pair, to set one of the bit lines BL and /BL at a VARY level and the other of the bit lines at a VSSSA level. During an inactive state of the sense amplifier, transistors FSAPT and FSAET are turned off, and the precharge/equalizing circuit 202 supplies a VARY/2 voltage to power source lines PCS and NCS, whereby the potential of bit line pair BL and /BL is precharged at a VARY/2 level.

FIG. 18 shows a control-signal generation circuit which controls each constituent element of the semiconductor memory device. FIG. 19 is a waveform diagram showing operation of the semiconductor memory device.

Signal R1ACT is a bank selection signal, and complementary signal RF9T is a mat selection signal, wherein mat selection signals RF9T<0> and RF9T<1> are controlled so that either one of these signals is activated. In FIG. 19, the bank is selected if the bank selection signal R1ACT rises to a high level (H-level). Memory mat MAT0 can be selected by controlling mat selection signal RF9T<0> to a H-level, and mat selection signal RF9T<1> to a low level (L-level).

Signal BLEQ is a control signal for the precharge/equalizing circuit 201 which performs precharge of the bit line pair in the memory mat. If bank selection signal R1ACT assumes a H-level and mat selection signal RF9T<0> assumes a L-level, signal BLEQ0 assumes a L-level and the precharge/equalizing circuit 201 for memory mat MAT0 is inactivated. In this case, since bank selection signal R1ACT and signal BLEQ1 assume L-level and H-level, respectively, the precharge/equalizing circuit 201 for memory mat MAT1 is activated.

Signal SHR is a control signal for the shared transistors SHR0 and SHR1. If bank selection signal R1ACT assumes a H-level and mat selection signal RF9T<1> assumes a L-level, signal SHR0 assumes a H-level, and shared transistor SHR0 for memory mat MAT0 is turned ON. In this case, since both bank selection signal R1ACT and mat selection signal RF9T<0> assume a H-level, signal SHR1 assumes a L-level and shared transistor SHR1 for memory mat MAT1 is turned OFF. At this stage, the precharge/equalizing circuit 201 for memory mat MAT1 is activated to precharge the bit line pair in memory mat MAT1 to a VARY/2 level.

Signal CSEQ is a control signal for a precharge/equalizing circuit 202 which precharges the bit line pair in the sense amplifier. Signal CSEQ assumes a L-level, if the bank is selected and any of the memory mats is selected. If signal CSEQ assumes a L-level, the precharge/equalizing circuit 202 is inactivated and power source lines PCS and NCS assume a floating state. In addition, precharge of the bit line pair in the sense amplifier is terminated. Thereafter, a word line WL is activated to couple a selected memory cell to the bit line pair, whereby the potential of the bit line pair in the memory mat and bit line pair in the sense amplifier change their potentials depending on the data read from the memory cell.

Signals RSAET and RSAPT are activation signals of low-potential power source and high-potential power source, respectively, for the sense amplifier. If signal RSAET assumes a H-level under the condition that any one of the memory mats is selected, signal FSAET assumes a H-level, which allows transistor FSAET to be tuned ON, whereby a VSSSA voltage is supplied to power source line NCS. On the other hand, if signal RSAPT assumes a H-level under the condition that any one of the memory mats is selected, signal FSAPT assumes a H-level, which allows transistor FSAPT to be turned ON, whereby a VARY voltage is supplied to power source line PCS.

After the word line WL is activated to allow the stored data to be output to the bit line pair, a sense amplifier is activated. The activation of sense amplifier is performed by controlling signal RSAET to assume a H-level, thereby raising signal FSAET to a H-level to turn ON transistor FSAET. The On-state of transistor FSAET lowers the potential of the low-potential power source line NCS of the sense amplifier from the VARY/2 level to a VSSSA level. The potential of VSSSA level of source line NCS allows one of the two n-channel transistors in the sense amplifier to turn ON, thereby lowering one of the bit lines BL and /BL having a lower potential to a VSSSA level.

Subsequently, signal RSAPT is controlled to assume a H-level and allow signal FSAPT to assume a H-level, whereby transistor FSAPT turns ON. The potential of the high-potential power source line PCS of the sense amplifier rises from VARY/2 level to a VARY level due to the turn-ON of transistor FSAPT. The VARY level of power source line PCS allows one of the two p-channel transistors to turn ON, whereby the potential of one of the bit lines BL and /BL having a higher potential rises to a VARY level. These operations of the sense amplifier fix the potential of bit line pair to a VARY level and a VSSSA level.

A read command etc. to a memory cell array is executed after completion of the sensing operation by sense amplifier, and thereafter a precharge command is issued. The word line WL is inactivated to assume a L-level after the issuance of the precharge command, to allow signals RSAET and RSAPT to assume a L-level, whereby transistors FSAET and FSAPT turn OFF to stop the power supply to power source lines PCS and NCS. In addition, mat selection signal RF9T<0> and bank selection signal R1ACT are then lowered from a H-level to a L-level, to allow signal BLEQ0, signal SHR1, and signal CSEQ to rise from a L-level to a H-level. Signal BLEQ1 and signal SHR0, which are maintained at a H-level, do not change the level thereof.

Signal BLEQ0 for memory mat MAT0 assumes a H-level, to activate precharge/equalizing circuit 201 for memory mat MAT0, whereby the bit line pair in memory mat MAT0 is precharged to a VARY/2 level. In the sense amplifier, precharge/equalizing circuit 202 is activated by signal CSEQ assuming a H-level, whereby the bit line pair in the sense amplifier is precharged to a VARY/2 level. In memory mat MAT1, shared transistor SHR1 turns ON due to signal SHR1 rising to a H-level, whereby the bit line pair in memory mat MAT1 are coupled to the bit line pair in the sense amplifier. The bit line pair in each memory mat MAT and the bit line pair in the sense amplifier are precharged by the above operations to a VARY/2 level.

The time interval between the completion of sensing by the sense amplifier and the issuance of precharge command in the operation shown in FIG. 19 is referred to as active standby period. This active standby period is specified by a maximum of, for example, 70 microseconds in the specification of the memory devices. Thus, a read/write operation is performed within the active standby period after issuing the read or write command.

In recent years, semiconductor memory devices, such as DRAM devices, have experienced a significant reduction in the power source voltage (VDD) thereof from 3.3V to 2.5V, and then to 1.8V. This voltage reduction inevitably reduces the internal, lower power source voltage VARY of the memory device from 2.4V to 1.5V, and then to 1.4V. Along with the reduction of the internal power source voltage VARY, the threshold voltage of the transistors configuring the sense amplifier is also reduced from 0.6V to 0.45V and then to 0.3V for improving the sensitivity of the sense amplifier. There is a problem, however, associated with the lower threshold in the semiconductor memory device that the leakage current increases due to the lower threshold voltage, the leakage current flowing across the transistors due to an incomplete OFF-state of the transistors during an inactive state of the sense amplifier.

FIG. 20 shows the circuit configuration and current flow of the sense amplifier during an activate state thereof. Transistors FSAPT and FSAET are tuned ON, and VARY and VSSSA voltages are supplied to power source lines PCS and NCS, respectively. In the example of FIG. 20, bit lines BL and /BL assume H-level and L-level, respectively, whereas p-channel transistor P201 and n-channel transistor N202 are ON, and p-channel transistor P202 and n-channel transistor N201 are OFF in the sense amplifier. In this state, the leakage currents include a first leakage current which flows though a current path-1 from power source line PCS via p-channel transistor P202 and n-channel transistor N202, which are OFF, toward power source line NCS, and a second leakage current which flows through path-2 from power source line PCS via p-channel transistor P201 and n-channel transistor N201, which are OFF, toward power source line NCS. In short, the sense amplifier which is active during the active standby period increases the leakage current and thus increases the power dissipation in the conventional semiconductor memory device.

Patent Publication JP-2001-6364A describes a technique for reducing the leakage current or penetrating current in the sense amplifier, wherein the sense amplifier is divided into four blocks, which are provided with respective switches between the blocks and the power source line and between the blocks and the ground line. In one or some of the blocks having an output line now selected, a corresponding switch or switches are turned ON to supply the power source, whereas switches in the other blocks are turned OFF to thereby reduce the penetrating current in the sense amplifier.

The semiconductor memory device has a large number of sense amplifiers. In the semiconductor device described in the above publication, the sense amplifies are maintained in an active state during the active standby period. However, the leakage current of the sense amplifiers may cause the semiconductor memory device not to satisfy the IDD3 (active standby current or active power-down standby current) code specified for the active standby period of the memory device. In the above patent publication, the blocks not used are isolated off from the power source line to inactivate the sense amplifier. However, in a DRAM device, the data of the selected memory cell must be amplified and restored in the memory cell after the readout of data from the memory cell, and thus the sense amplifiers must not be inactivated without consideration of this fact. The above patent publication is silent to this fact, and thus the invention of this publication cannot be expected to solve the above problem in the DRAM device.

SUMMARY OF THE INVENTION

In view of the above, it is an object of the present invention to provide a semiconductor memory device which is capable of reducing the power dissipation during an active standby period of the semiconductor memory device.

The present invention provides a semiconductor memory device including: a memory cell array including a first bit line pair and a plurality memory cells connecting to the first bit line pair, a selected one of the memory cells delivering data to or receiving data from said first bit line pair; a sense amplifier including therein a second bit line pair and an amplifying element amplifying a potential difference between bit lines of the second bit line pair; and a transfer gate for controlling coupling of the first bit line pair and the second bit line, wherein after the sense amplifier amplifies, upon selection of one of the memory cells, the potential difference between bit lines of the second bit line pair coupled to the first bit line pair by the transfer gate, the transfer gate isolates the second bit line pair from the first bit line pair, and the sense amplifier is inactivated.

The above and other objects, features and advantages of the present invention will be more apparent from the following description, referring to the accompanying drawings.

PREFERRED EMBODIMENTS OF THE INVENTION

Figure 1:
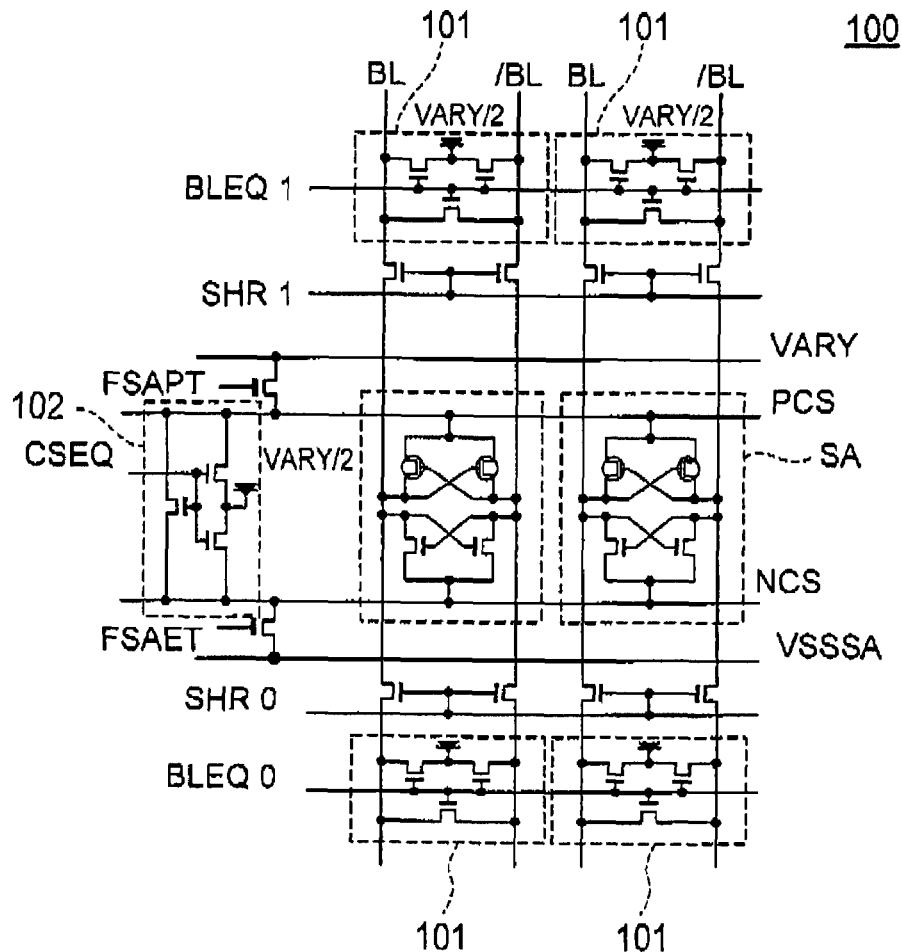
FIG. 1 is a circuit diagram of a semiconductor memory device according to a first embodiment of the present invention, showing the vicinity of a sense amplifier.

Now, exemplary embodiments of the present invention will be described with reference to accompanying drawings, wherein similar constituent elements are designated by similar reference numerals throughout the drawings.

Figure 17:
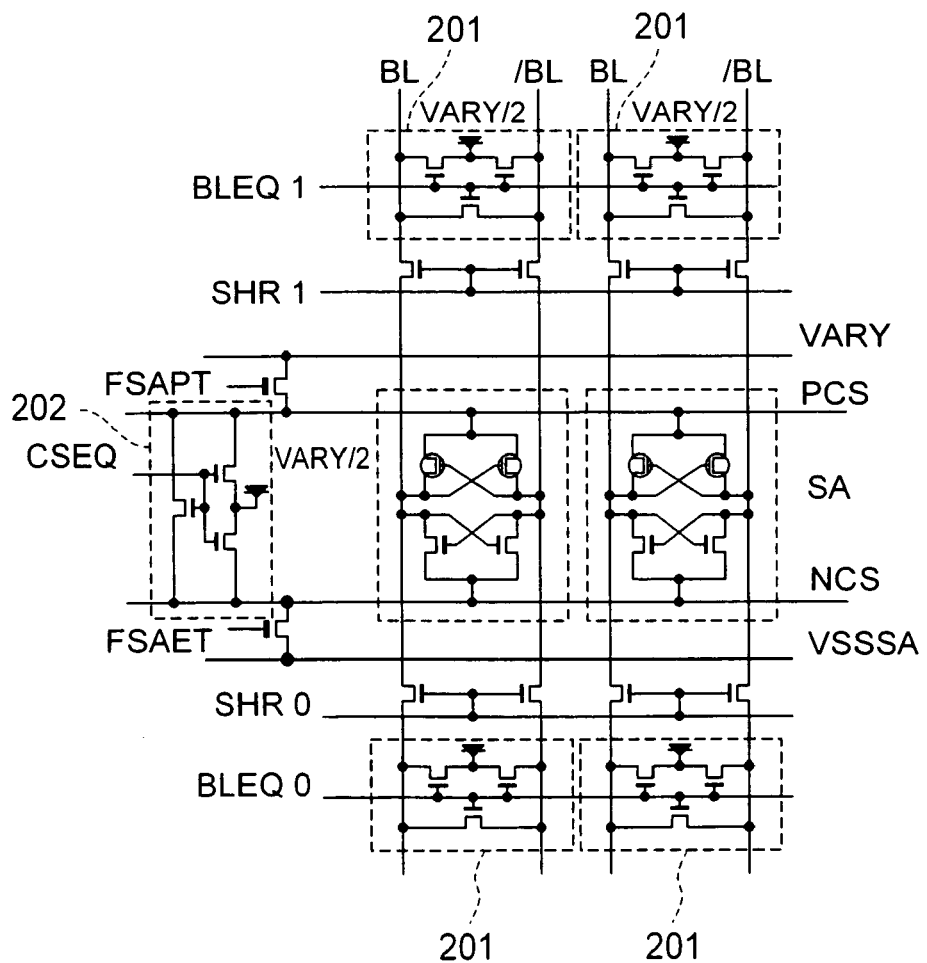
FIG. 17 is a circuit diagram of the sense amplifier shown in FIG. 16 and the vicinity thereof.

FIG. 1 shows the circuit configuration in the vicinity of a sense amplifier in a semiconductor memory device according to a first embodiment of the present invention. The circuit configuration of the memory cell array shown in FIG. 1 is similar to the circuit configuration shown in FIG. 17. More specifically, the semiconductor memory device 100 is configured as a DRAM device, and includes a memory cell array including a plurality of memory mats, and a peripheral circuit area not shown. The memory cell array includes, in each of the memory mats, a plurality of memory cells, a plurality of bit line pairs extending parallel to one another in a column direction of the memory cells, and a plurality of word lines extending parallel to one another in a row direction of the memory cells. The memory device 100 also includes a sense amplifier block including a plurality sense amplifiers each corresponding to one of the bit line pairs. Shared transistors SHR0 and SHR1 control coupling between a bit line pair (BL, /BL) in the memory mat and a bit line pair (BL and /BL) in the sense amplifier. A precharge/equalizing circuit 101 is used to precharge the bit line pair in the memory mat to a VARY/2 level, The sense amplifier has two p-channel transistors and two n-channel transistors. Each of the p-channel transistors includes a source connected to a power source line PCS, a drain connected to bit line BL or bit line /BL, and a gate connected to the drain of the other of the p-channel transistors. Each of the n-channel transistors includes a source connected to a power source line NCS, a drain connected to bit line BL or bit line /BL, and a gate connected to the drain of the other of the n-channel transistors.

Transistors FSAPT and FSAET control coupling between power source line PCS and a power source line VARY and between power source line NCS and a power source line VSSSA, respectively. During an active state of the sense amplifier, transistors FSAPT and FSAET are controlled to be ON, to couple together power source line PCS and power source line VARY and couple together power source line NCS and power source line VSSSA. During an inactive state of the sense amplifier, a precharge/equalizing circuit 102 supplies a VARY/2 voltage between power source lines PCS and NCS, and precharges the potential of bit line pair BL and /BL to VARY/2 voltage.

Figure 2:
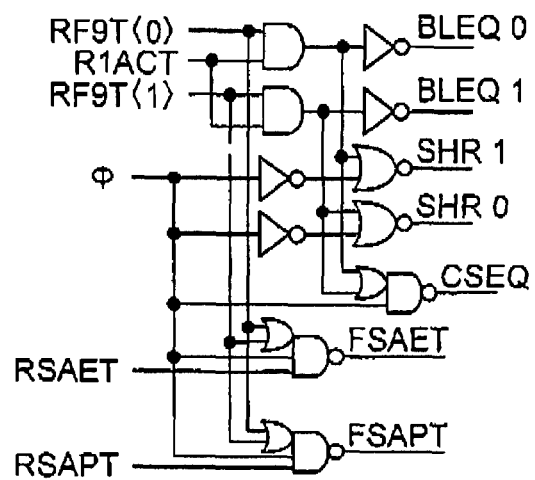
FIG. 2 is a circuit diagram of the control signal generation circuit in the semiconductor memory device of FIG. 1.
Figure 18:
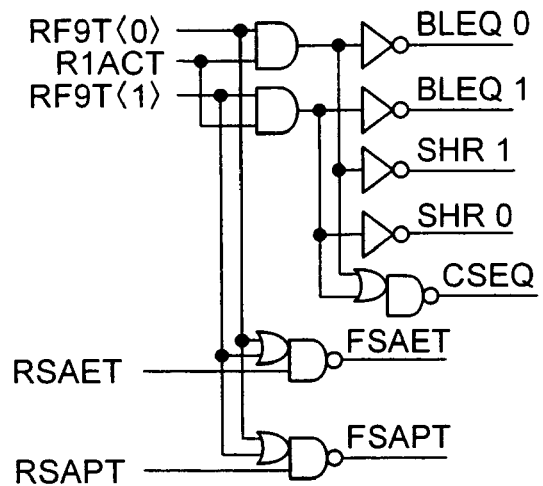
FIG. 18 is a circuit diagram of the control signal generation circuit in the semiconductor memory device of FIG. 16.

FIG. 2 shows the circuit configuration of a control signal generation circuit in the DRAM device. This circuit is similar to the circuit shown in FIG. 18, except that a signal φ(φ-signal) controls signals SHR0 and SHR1 to turn OFF shared transistors SHR0 and SHR1 at a desired timing. The φ-signal also control signals CSEQ, FSAET and FSAPT to turn OFF transistors FSAPT and FSAET at a desired timing, thereby inactivating the sense amplifier and precharging the bit line pair in the sense amplifier.

Figure 3:
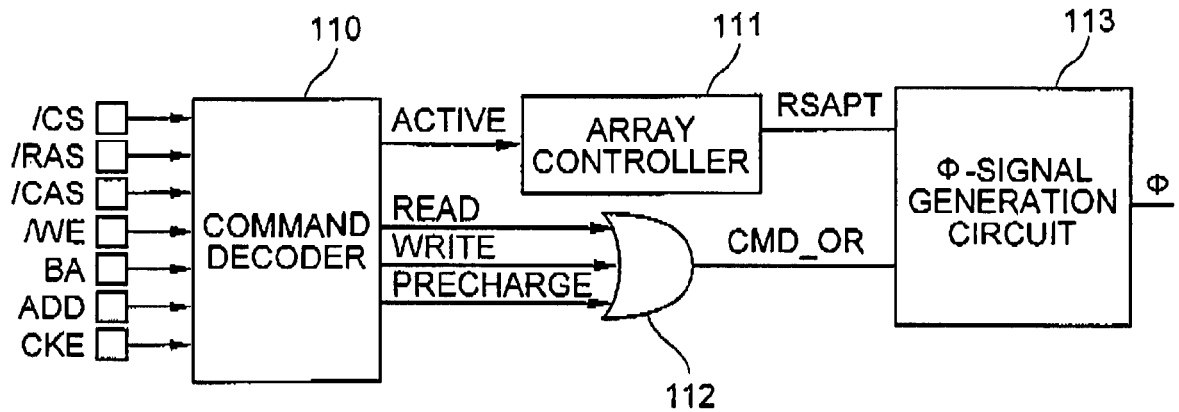
FIG. 3 is a block diagram of the φ-signal generation circuit in the semiconductor memory device of FIG. 1.

FIG. 3 shows the circuit configuration of the φ-signal generation circuit in the DRAM device 100 of FIG. 1. A command decoder 110 decodes the command signal input from external pins, such as /CS, /RAS, /CAS pins, and issues a control command which controls read/write operation of the memory device. An array controller 111 performs control operations such as selection of bank or memory mat, and activation of the sense amplifier based on the instruction from the command decoder 110. The array controller 111 transmits signal RSAPT which controls activation of the sense amplifier to the φ-signal generation circuit 113. An OR gate 112 transfers a CMD_OR signal to the φ-signal generation circuit 113 thereby informing occurring of any of read, write and precharge operations that has occurred.

The φ-signal generation circuit 113 inverts the φ-signal, such as from a H-level to a L-level, if a period in which neither of read, write and precharge operations occurs continues for a predetermined time length during the active standby period. More specifically, the φ-signal generation circuit 113 shifts the φ-signal from a H-level to a L-level if the φ-signal generation circuit 113 doe not receive a signal indicating occurring of any of read, write and precharge operations form the OR gate 112 within a specified time interval after signal RSAP input from the array controller 111 assumes a H-level. The φ-signal generation circuit also returns the φ-signal from the current L-level to the initial H-level if any of read, write and precharge operations occurs after shifting the φ-signal from the initial H-level to the L-level.

Figure 4:
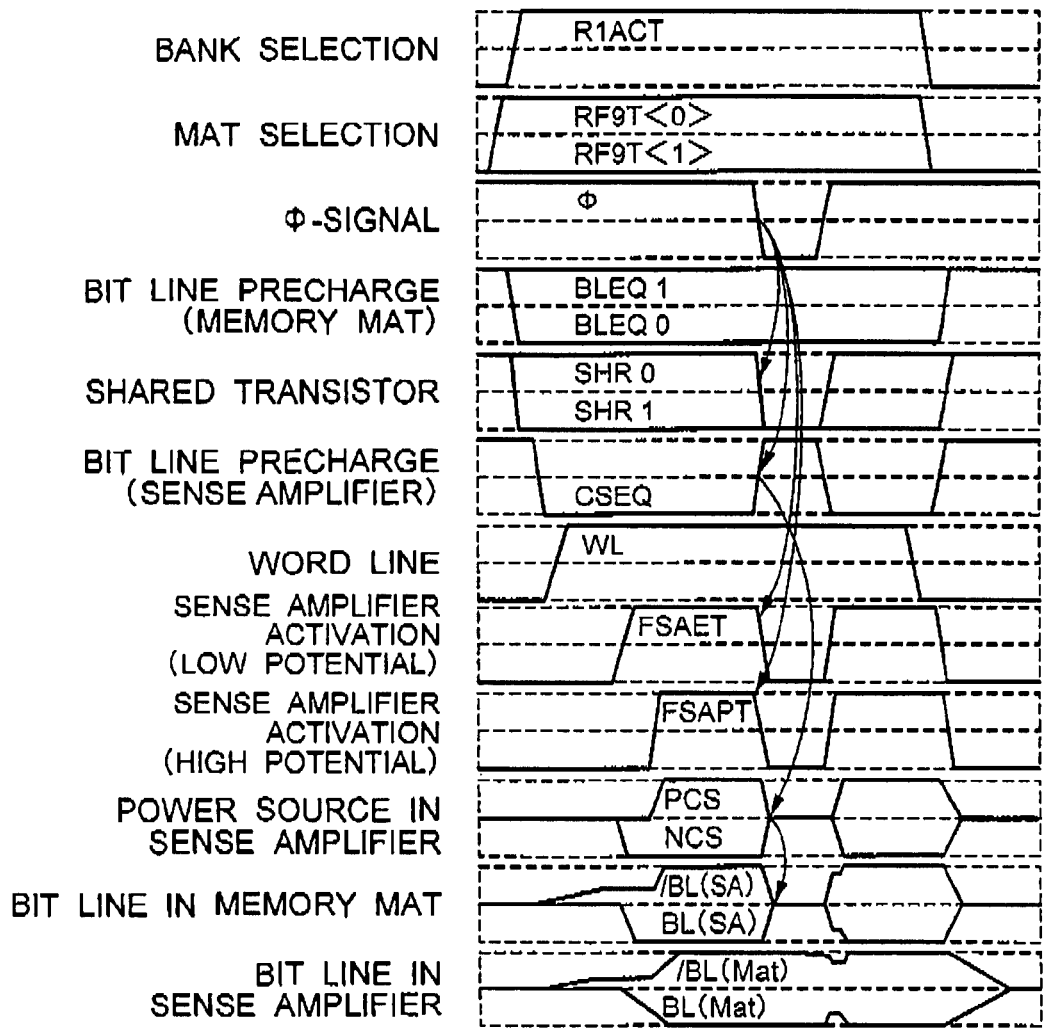
FIG. 4 is a waveform diagram showing operation of the semiconductor memory device of FIG. 1.
Figure 19:
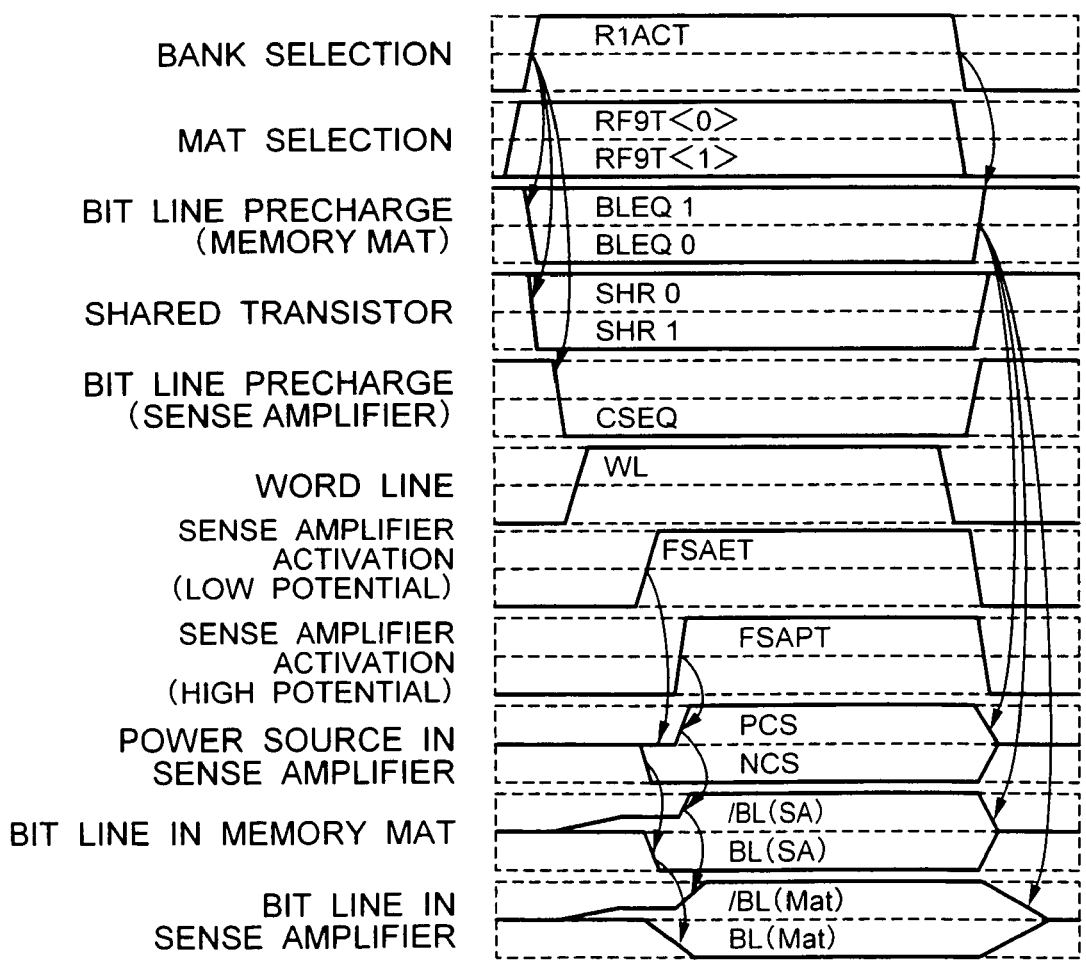
FIG. 19 is a waveform diagram showing operation in the semiconductor memory device of FIG. 16.
Figure 20:
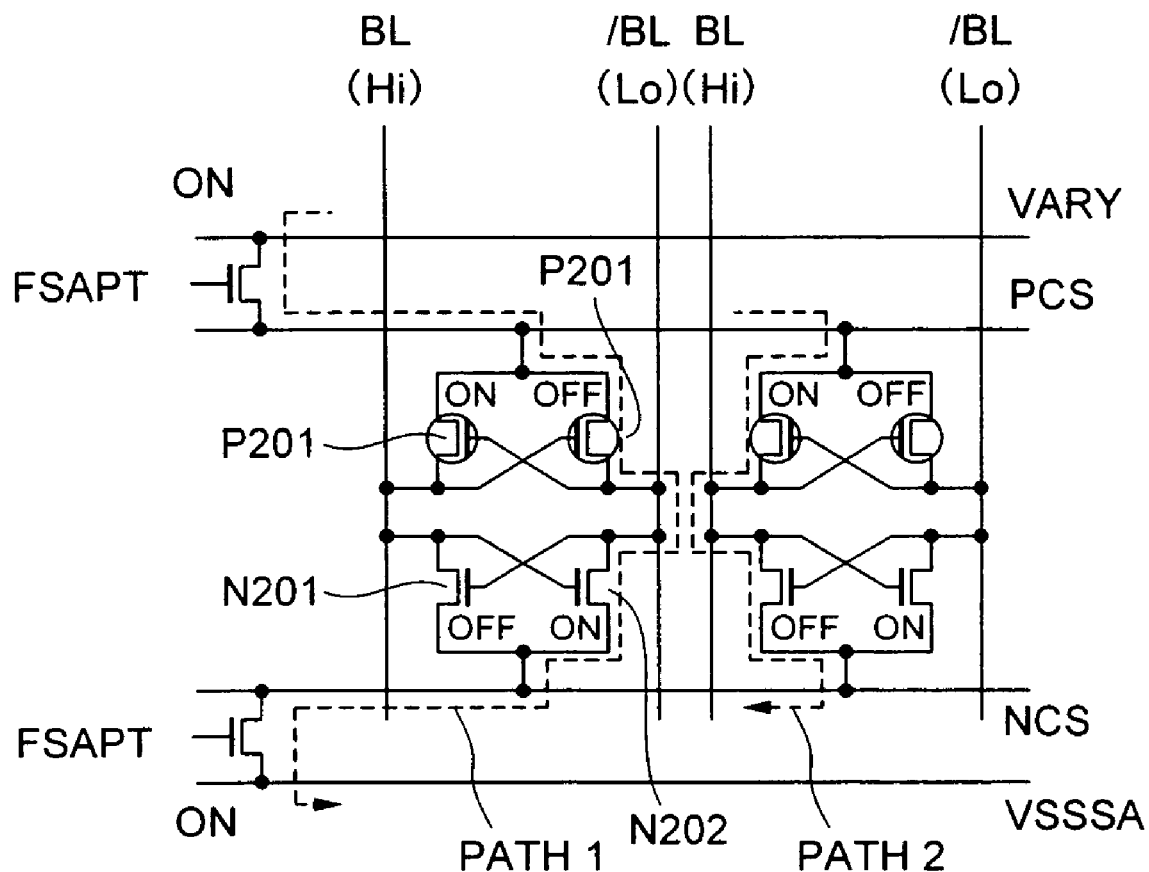
FIG. 20 is a circuit diagram of the sense amplifier shown in FIG. 16.

FIG. 4 shows a waveform diagram showing operation of the semiconductor memory device 100. Operations from selection of a bank by using signal R1ACT, selection of a memory mat (MAT) by using signal RF9T, activation of a word line to deliver data from a selected memory cell to the bit line pair, activation of the sense amplifier to fix the potential of the bit line pair to a VARY or VSSSA level are similar to those in the memory device of FIG. 19. If the command decoder 110 does not deliver any of read, write and precharge commands within a specified time interval since the activating timing of the sense amplifier, which occurs subsequent to fixing of the VARY or VSSSA level on the bit line pair due to the H-level of signal RSAPT activating the sense amplifier, the φ-signal generation circuit shifts the φ-signal from a H-level to a L-level.

With reference to FIG. 2, fall of the φ-signal to a L-level allows signal SHR0 to fall from a H-level to a L-level and turn OFF shared transistor SHR0. In addition, both signals FSAPT and FSAET fall from a H-level to a L-level, to turn OFF transistors FSAPT and FSAET, whereby power source lines PCS and NCS are isolated from power source lines VARY and VSSSA, respectively. Further, signal CSEQ rises from a L-level to a H-level to activate precharge/equalizing circuit 102, whereby power source lines PCS and NCS assume a VARY/2 level. Thus, bit line pair in the sense amplifier are precharged to a VARY/2 level.

In the above operation, the sense amplifier is inactivated to allow precharge of the bit line pair in the sense amplifier to a VARY/2 level, whereby the OFF-leakage current, which flows from the high-potential power source line PCS toward the low-potential power source line NCS via the turned-OFF transistors in the sense amplifier, is blocked. Accordingly, the power dissipation in the active standby period of the memory device can be reduced. Since shared transistor SHR0 is OFF at this stage, the bit line pair in the memory mat is isolated from the bit line pair in the sense amplifier. The data delivered from the memory cell to the bit line pair is maintained by the bit line pair in the memory mat which assume a floating state at this stage.

If any of read, write and precharge commands is issued by the command decoder 110, the φ-signal generation circuit 113 returns the level of φ-signal to a H-level. This inactivates the precharge/equalizing circuit 102 to terminate the precharge of the bit line pair in the sense amplifier. In addition, shared transistor SHR0 couples together the bit line pair in the sense amplifier and the bit line pair in the memory mat. Transistors FSAPT and FSAET, which are also turned ON, supply power source voltages VARY and VSSSA to power source lines PCS and NCS, respectively, whereby the sense amplifier is activated.

The sense amplifier thus activated performs differential amplification of the coupled bit line pairs based on the potential of the bit line pair in the memory mat. Thus, the potential of the bit line pair in the sense amplifier and the bit line pair in the memory mat returns to the initial state at which the φ-signal falls to the L-level to inactivate the sense amplifier. Thereafter, similarly to the circuit shown in FIG. 19, the word line is inactivated to lower mat election signal RF9T<0> and bank selection signal R1ACT to a L-level, and shared transistor SHR1 of the memory mat not selected at this stage is tuned ON to precharge the bit line pair in the sense amplifier and the bit line pair in the memory mat.

Figure 5:
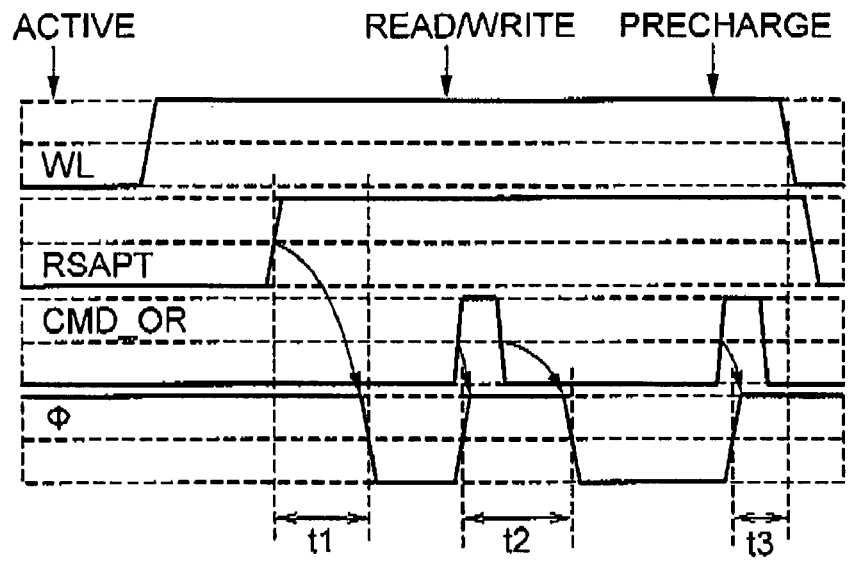
FIG. 5 is a diagram of the waveforms generated in the φ-signal generation circuit.

Now, protection periods will be described for assuring the time length needed for the φ-signal to turn OFF shared transistors SHR0 and SHR1 and thereby precharge the bit line pair in the sense amplifier to a VARY/2 level. FIG. 5 shows a timing chart showing waveforms in the φ-signal generation circuit shown in FIG. 3. Upon the potential rise of the word line, signal RSAPT rises to a H-level to activate the sense amplifier. A first protection period having a time length of t1 is then secured after the start of sensing by the sense amplifier, so that the sense amplifier is not inactivated by a transition of signal RSAPT to a H-level before the potentials of the bit liner pair are established at VARY and VSSSA levels. For this purpose, the φ-signal is allowed to stay at the L-level during the first protection period t1 so as not to inactivate the sense amplifier. In other words, the φ-signal generation circuit 113 lowers the φ-signal to a L-level to inactivate the sense amplifier after the first time length of t1 elapsed since the rise of signal RSAPT to the H-level, if a read/write command doses not occur within the first time length t1 since the rise of signal RSAPT.

If a command, such as a read/write command, occurs during an inactive state of the sense amplifier, the φ-signal generation circuit 113 returns the φ-signal to a H-level to activate the sense amplifier. If another read/write command, for example, occurs at this stage, the φ-signal is maintained at the H-level, whereas if another read/write command does not occur at this stage, the φ-signal is lowered to a L-level to inactivate the sense amplifier. A second protection period t2 is secured after the activation of the sense amplifier, for assuring restoring of data in the memory cell and for protecting the read/write operation. More specifically, the φ-signal generation circuit 113 does not lower the φ-signal to a L-level before the second protection period t2 elapses since the sense amplifier is activated from an inactivated state after signal CMD_OR output form the OR gate 112 assumes a H-level. If another read/write command occurs to allow signal CMD_OR of OR gate 112 to assume a H-level before the second protection period t2 elapses, the φ-signal is maintained at the H-level. A third protection period t3 is a period for protecting the restoring operation after occuring of a precharge command. Before the third protection period t3 elapses since the occurring of the precharge command, the sense amplifier is not inactivated to assure a sufficient restoring operation.

Figure 6A:
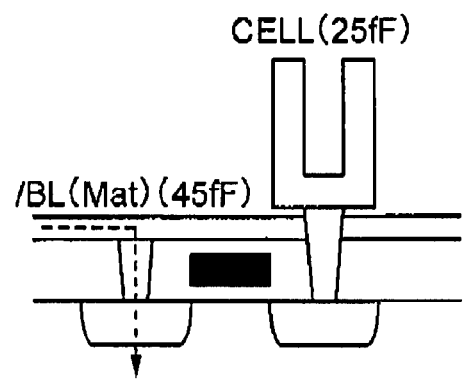
FIG. 6A is a sectional view of a transistor provided in the memory cell in the semiconductor memory device of FIG. 1.
Figure 6B:
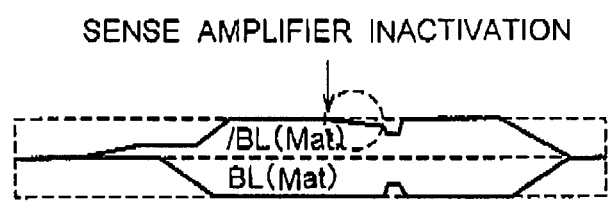
FIG. 6B is a diagram of the potential of the bit line pair connected to the memory cell.

FIG. 6A is a sectional view of a cell transistor in a memory cell. After the sense amplifier is inactivated, the bit line pair in the memory mat is isolated from the bit line pair in the sense amplifier to assume a floating state and mains the data thereon. If one of the bit lines, such as bit line /BL, in the bit line pair assumes a H-level, as shown in FIG. 6B, the potential of bit line /BL is gradually lowered with time until the sense amplifier is again activated, due to the leakage path of the cell transistor formed across the p-n junction of the diffused region.

It is assumed here that a single memory cell has a capacitance Cs of 25 fF and a single bit line has a capacitance CD of 45 fF, and that the refreshment cycle $t_{REF}$ is proportional to the capacitance, and the refreshing current corresponds to the leakage current of the memory cells. If a single bit line is connected to 256-bit memory cells, bit line /BL has a leakage current of 256 times the leakage current of a single memory cell. In this case, assuming that $t_{REF}$=64 ms, the data retention time of the floating bit line /BL equals to:

64 ms×45 fF/(25 fF×256)=450 µs.

Figure 7:
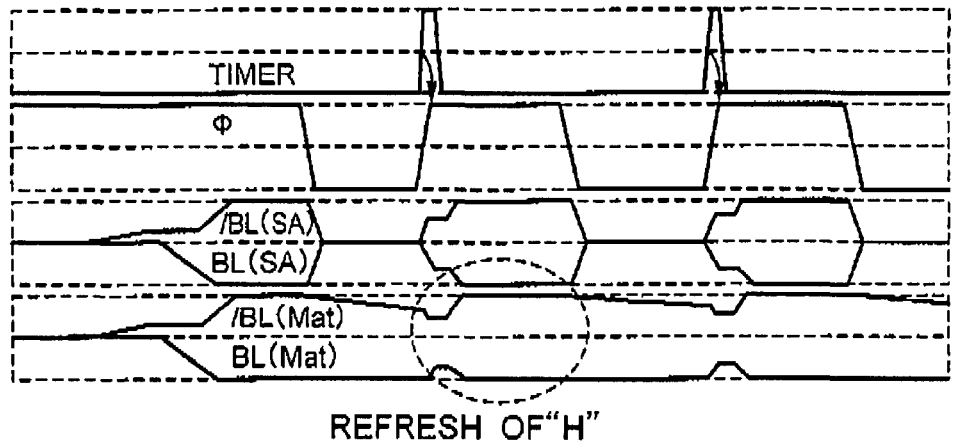
FIG. 7 is a waveform diagram showing the relationship between the φ-signal and the potential of the bit line.

Since the floating time length of the bit line is smaller tan the active standby period which is 70 µs at the maximum, as specified by the specification of the DRAM device, the above data retention time, 450 µs, does not cause any data loss. If the leakage current is excessively large, or if the active standby period is specified at a larger value in the future specification, a control scheme may be used wherein, as shown in FIG. 7, a timer is used to output a periodical pulse signal, based on which the φ-signal is raised to a H-level, whereby the inactive state of the sense amplifier does not continue for a long time during the active standby period.

In the present embodiment during the active standby period, shared transistors SHR0 and SHR1 are OFF to isolate the bit line pair in the sense amplifier from the bit line pair in the memory mat, and the sense amplifier is inactivated to allow the bit line pair in the sense amplifier to be precharged at a VARY/2 level. This reduces the OFF-leakage current which flows from the high-potential power source line PCS toward the low-potential power source line NCS via the transistors configuring the sense amplifier, to thereby reduce the power dissipation during the active standby period. Accordingly, a transistor having a lower threshold voltage can be used for the sense amplifier to have a higher speed, without incurring a significant amount of the leakage current. In general, in an inactive state of the sense amplifier, the read data read out from the memory cell to the bit line pair in the sense amplifier is not held; however, the read data is maintained on the bit line pair having a floating state in the memory mat. The read data maintained on the bit line pair in the memory mat is amplified by the sense amplifier upon the data recovery stage after one of shared transistors SHR0 or SHR1 for the memory mat which is selected is turned ON to obtain a combined bit line pair, without incurring a problem for the read data.

Figure 8:
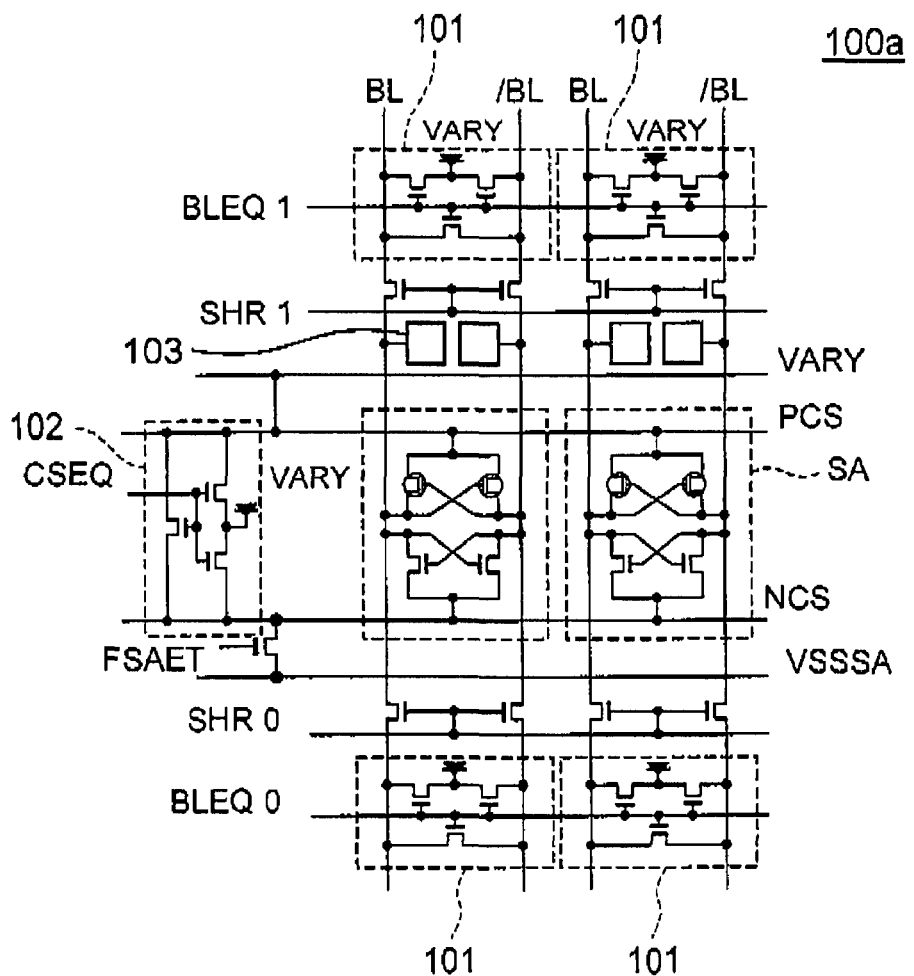
FIG. 8 is a circuit diagram of a semiconductor memory device according to a second embodiment of the present invention, showing the vicinity of a sense amplifier.

FIG. 8 shows the configuration of a semiconductor memory device according to a second embodiment of the present invention. The semiconductor memory device 100a of the present embodiment is similar to the memory device 100 of the first embodiment except that precharging of the bit line pair to a VARY level is used in the present embodiment instead of precharging at a VARY/2 level. In the next and subsequent generations of the semiconductor memory device, a further lower voltage may be used as a power source voltage. In this case, transistors configuring the sense amplifier may have a lower threshold voltage in conformity with the reduced power source voltage. This will cause a difficult in the memory device having a precharge level of VARY/2, and necessitate using a precharge level of VARY.

The semiconductor memory device 100a of the present embodiment has a configuration similar to the configuration shown in FIG. 1, and in addition thereto, a reference-potential generation circuit 103. The reference-potential generation circuit 103 has a capacitance equal to around half the capacitance of the memory cell, and outputs, upon activation of the world line, a potential corresponding to data "0" to one of the bit lines BL and /BL which is not coupled to the memory cell. For example, it is assumed here that the memory cell is coupled to bit line BL, the memory cell has a capacitance of 10 fF, and the reference-potential generation circuit 103 has a capacitance of 5 fF. When the memory cell delivers data corresponding to "0" to bit line BL, the potential of bit line BL is somewhat lowered from the VARY level which is the precharge voltage. At this stage, the potential of bit line /BL is also somewhat lowered from the VARY level, after the reference-potential generation circuit 103 outputs the potential corresponding to "0". In this case, since the capacitance of the memory cell is larger than the capacitance of the reference-potential generation circuit 103, the potential drop of bit line /BL is smaller an the potential drop of bit line BL. This potential difference is amplified by the sense amplifier, to fix the potential of bit lines at VARY or VSSSA depending on the read data.

Figure 9:
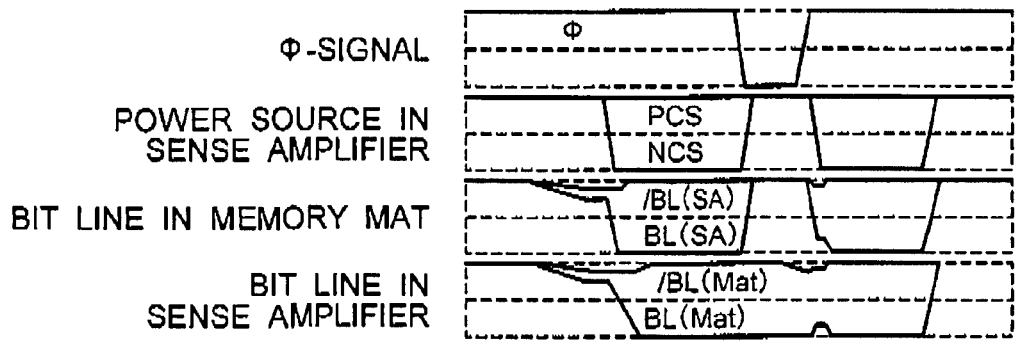
FIG. 9 is a waveform diagram showing operation of the semiconductor memory device of FIG. 8.

FIG. 9 shows a diagram of waveforms generated in the operation of the semiconductor memory device 100a. In the present embodiment, due to precharging of the bit line pair to a VARY level, the initial potential of power source lines PCS and NCS of the sense amplifier as well as the initial potential of the bit line pair assumes the VARY level. After the potential of word line WL (not shown in FIG. 9) rises, the selected memory cell delivers data onto the bit line pair. Signal RSAET allows power source line NCS to receive a VSSSA level and activate the sense amplifier, whereby the potential of one of the bit lines BL and /BL having a lower potential is lowered to a VSSSA level by the sense amplifier thus activated, and, allow the potential of the other of the bit lines having a higher potential is raised to a VARY level.

The φ-signal generation circuit 113 (FIG. 3) lowers the potential of the φ-signal to a L-level if a period during which neither of read/write commands is issued continues a specific time length, to turn OFF shared transistors SHR0 and SHR1, activate the sense amplifier, and precharges the bit line pair in the sense amplifier to a VARY level. Thereafter, the φ-signal generation circuit 113 changes the φ-signal to the initial H-level upon occuring of a read/wrote command, to turn ON shared transistor SHR0 or SHR1 in the memory mat which is selected, and activate the sense amplifier to amplify the potential difference between the bit line pair in the memory mat coupled to the bit line pair in the sense amplifier. Thus, in the case of using a precharge potential of VARY level, the operation of each constituent element is similar to that in the case of using a precharge potential of VARY/2 level.

Figure 10:
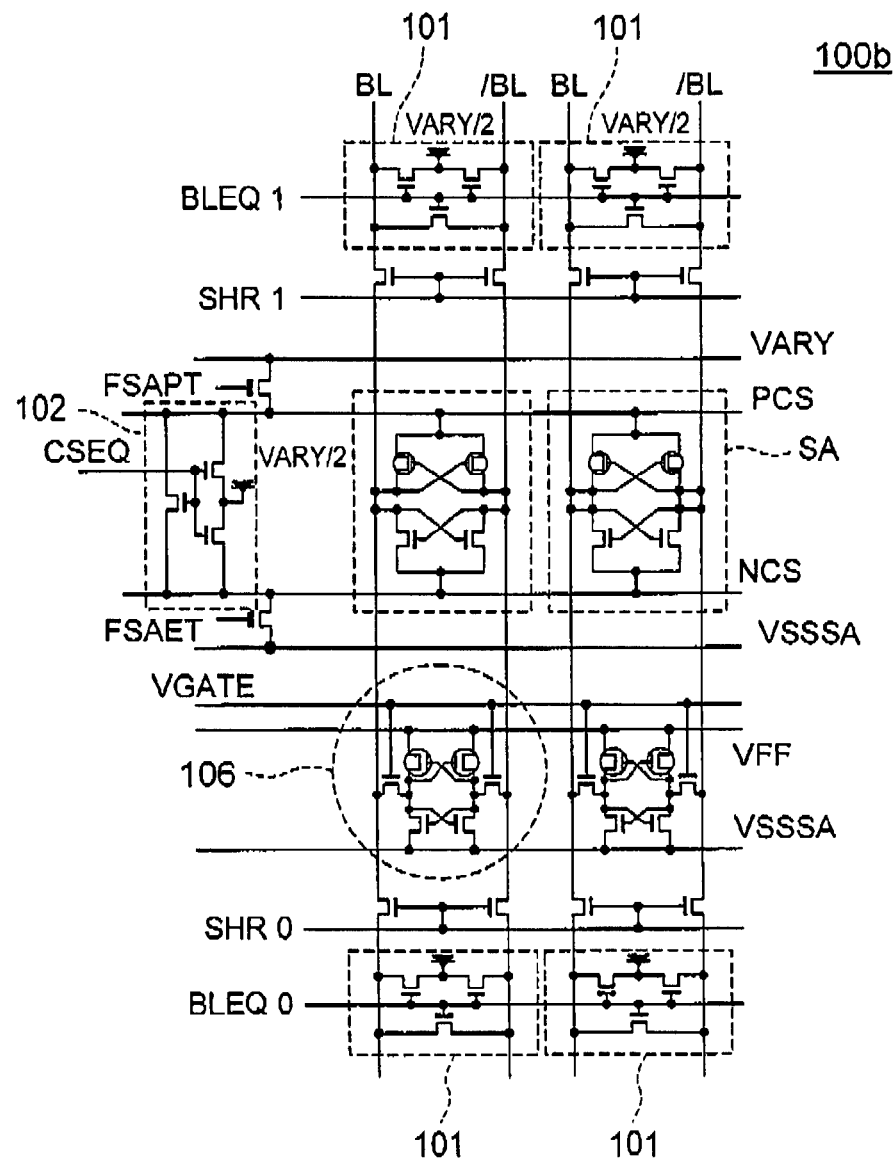
FIG. 10 is a circuit diagram of a semiconductor memory device according to a third embodiment of the present invention, showing the vicinity of a sense amplifier.

FIG. 10 shows the configuration of a semiconductor memory device according to a third embodiment of the present invention. The semiconductor memory device 100b of the present embodiment is similar to the semiconductor memory device 100 of the first embodiment except that a flip-flop 106 is used for temporarily storing data in the present embodiment. In this embodiment, after activating the sense amplifier to fix the potential of the bit line pair at VARY level and VSSSA level, the data on the bit line pair is stored in the flip-flop 106. Thereafter, the bit line pair in the sense amplifier and the bit line pair in the memory mat are precharged to a VARY/2 level, followed by read/write of data on the bit line pair by using the data stored in the flip-flop 106.

Figure 11:
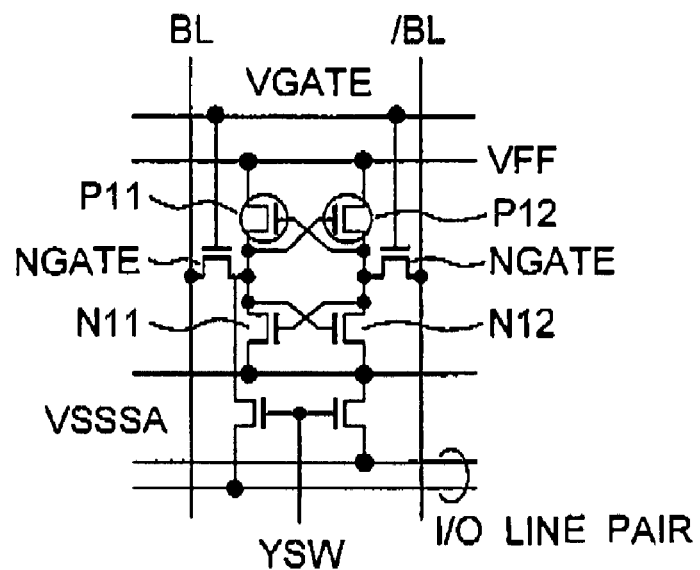
FIG. 11 is a circuit diagram of the flip-flop shown in FIG. 10.

FIG. 11 shows the detail of the flip-flop FF106 and the vicinity thereof. The flip-flop 106 includes two p-channel transistors P11, P12, two n-channel transistors N11, N12, and two gate transistors NGATE. The p-channel transistors P11 and P12 each include a source connected to a power source line VFF, and a drain connected to bit line L or bit line /BL via the gate transistor NGATE. The gate of each of p-channel transistors P11 and P12 is connected to the drain of the other of p-channel transistors P11 and P12. The n-channel transistors N11 and N12 each include a source connected to power source line VSSSA, and a drain connected to bit line BL or bit line /BL via the gate transistor NGATE. The gate of each of n-channel transistors N11 and N12 is connected to the drain of the other of n-channel transistors.

The gate transistors NGATE control coupling between bit lines BL, /BL and the drain of transistors P11, P12, N11, and N12. The gate transistors NGATE are controlled to be ON or OFF based on a signal VGATE. The flip-flop 106 receives data from the bit line pair and delivers the data thereto during the ON state of the gate transistors NGATE. The node connecting together transistors P11 and N11 and the node connecting together transistors P12 and N12 are connected to an I/O node pair of the flip-flop 106 via transistors controlled by a signal YSW.

The flip-flop 106 has a function of storing data without amplifying the data differently from the sense amplifier which amplifies the potential difference between the bit line pair. Thus, the transistors of the flip-flop 106 may have a threshold voltage higher than the threshold voltage of the transistors of the sense amplifier. In addition, the transistors of the flip-flop 106 may have a smaller size compared to the transistors of the sense amplifier. The flip-flop 106 operates on the power source supplied between power source line VFF and power source line VSSSA. The source voltage of power source line VFF may be equal to or higher than the source voltage VARY. In particular, if the source voltage VARY is lower, power source line VFF may be significantly higher than VARY, to compensate a reduction in the operating speed caused by the lower VARY.

Figure 12:
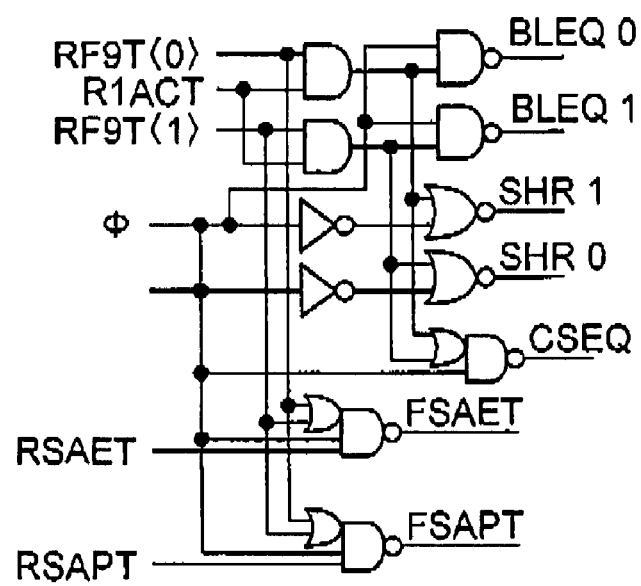
FIG. 12 is a circuit diagram of a control signal generation circuit in the semiconductor memory device of FIG. 10.

FIG. 12 shows the circuit configuration of the control signal generation circuit in the semiconductor memory device 100b of the present embodiment. The control signal generation circuit is similar to the control signal generation circuit in the semiconductor memory device 100 of the fit embodiment shown in FIG. 2 except that the φ-signal is used to control signals BLEQ0 and BLEQ1 which control the precharge/equalizing of the bit line pair in the memory mat. More specifically, control of the φ-signal to a L-level turns OFF shared transistors SHR0 and SHR1, to inactivate the sense amplifier and precharge the bit line pair in the sense amplifier by using signal CSEQ, and at the same time raises signals BLEQ0 and BLEQ1 to a H-level, which allows the bit line pair in the memory mat to be precharged to a VARY/2 level.

Figure 13:
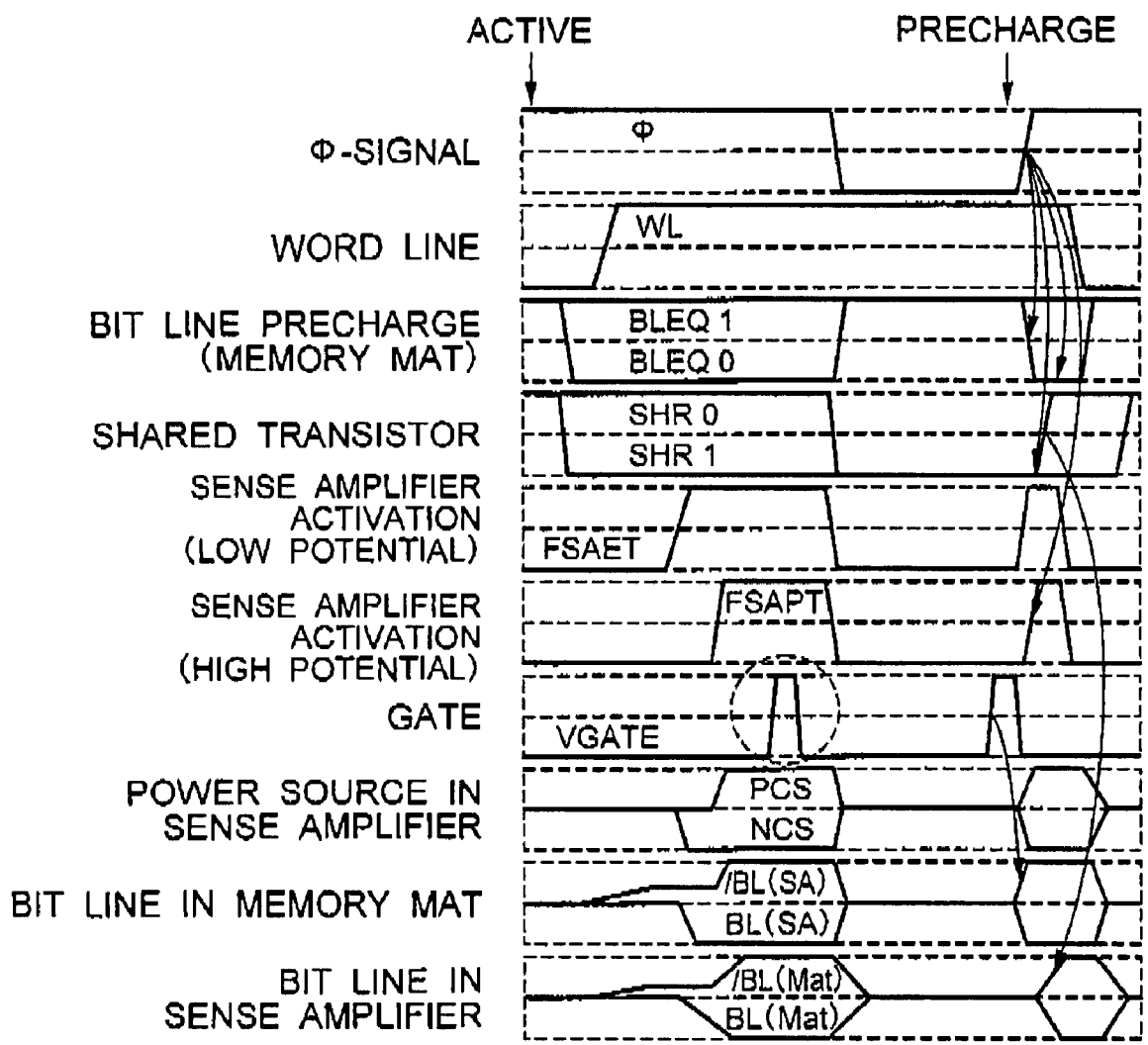
FIG. 13 is a waveform diagram showing operation of the semiconductor memory device of FIG. 10.

FIG. 13 shows a diagram of the waveform of each constituent element in the semiconductor memory device 100b. Operations from activation of the word line, activation of the sense amplifier and fixing the potential of bit line pair to VARY and VSSSA are similar to those in FIG. 4. After the activation of the sense amplifier; signal VGATE turns ON the gate transistors NGATE in the flip-flop 106 to write the data held on the bit line pair into the flip-flop 106. Thereafter, the φ-signal is lowered to a L-level to turn OFF shared transistor SHR0, inactivate the sense amplifier and precharge the bit line pair in the sense amplifier to a VARY/2 level. Signal BLEQ is also changed at this stage to a H-level to precharge the bit line pair in the memory mat to a VARY/2 level in the present embodiment, concurrently with raising the potential of signal CSEQ (not shown in FIG. 13) which controls precharge/equalizing of the bit line pair in the sense amplifier.

The flip-flop 106 holds the data received at the timing of a H-level of signal VGATE, by the function of four transistors P11, P12, N11, and N12. When a read/write command is issued to the command decoder (FIG. 3), the flip-flop 106 delivers the data to the I/O line pair to execute the read/write command. The φ-signal generation circuit 113 returns the φ-signal to the initial H-level after a precharge command is issued. Thus, shared transistor SHR0 is turned ON again, to again activate the sense amplifier and terminate the precharge/equalizing of the bit line pair. Signal VGATE is controlled to assume a H-level and to thereby deliver the data held by the flip-flop 106 to the bit line pair in the sense amplifier. As a result, the data read before the φ-signal is controlled to assume the L-level is delivered onto the bit line pair in the sense amplifier as well as the sense amplifier in the memory mat, whereby the data before the φ-signal changes to the L-level is restored into the memory cell.

In the present embodiment, the data held on the bit line pair is stored in the flip-flop 106 after completion of the differential amplification of the bit line pair by the sense amplifier, and thereafter, the φ-signal is lowered to a L-level, to inactivate the sense amplifier and precharge the bit line pairs in the sense amplifier and memory mat to a VARY/2 level. In addition, before inactivating the word line, the φ-signal is returned to a H-level to restore the data in the memory cell from the flip-flop 106 via the bit line pair. Due to the configuration wherein the read/write operation is conducted to the flip-flop 106, activation of the sense amplifier is unnecessary upon the read/write operation, whereby the sense amplifier can be maintained in the inactive state.

It is to be noted in the first embodiment that the sense amplifier should be activated each time a read/write command is issued. In this case, if the read/write command is issued in a sporadic basis, the operating current of the sense amplifier and shared transistor SHR may increase the power dissipation. On the other hand, since the execution of read/write command is performed by the flip-flop 106 in the present embodiment, the activation of the sense amplifier is performed only once before the word line is inactivated. This suppresses increase of the power dissipation even if the read/write command is issued on a sporadic basis. In addition, since the refreshing operation of the bit line pair is not needed and the write operation is performed quickly, there is another advantage in that signal YSW delivered upon a write operation may have a smaller pulse width.

Figure 14:
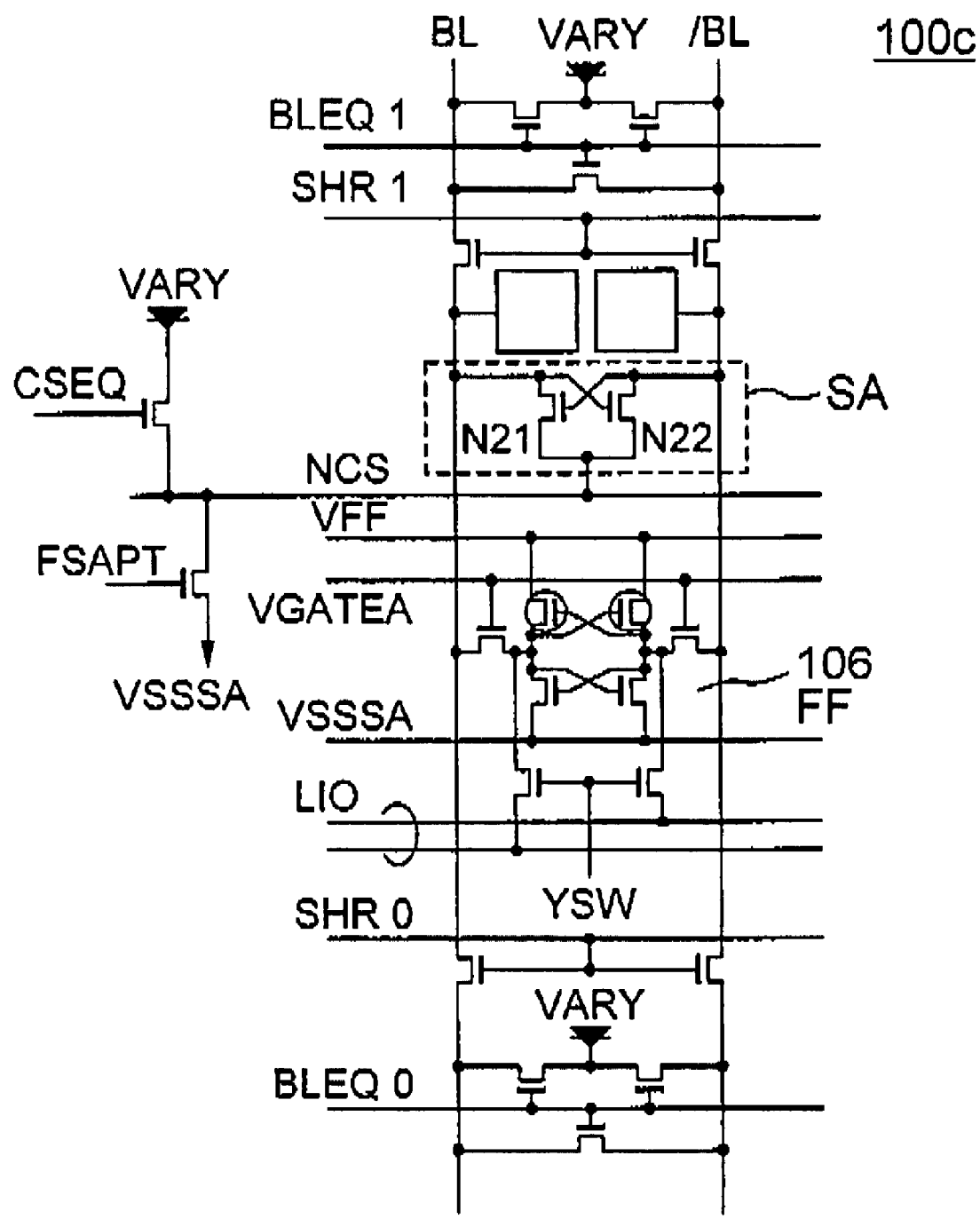
FIG. 14 is a circuit diagram of a semiconductor memory device according to a fourth embodiment of the present invention, showing the vicinity of a sense amplifier.

FIG. 14 shows the configuration of a semiconductor memory device according to a fourth embodiment of the present invention. The semiconductor memory device 100c of the present embodiment is configured by combining the configurations of the second and third embodiments to include the flip-flop 106 and employ precharging of the bit line pair to a VARY level. The sense amplifier includes two n-channel transistors N21 and N22. Power source line NCS is coupled to power source line VSSSA via transistor FSAET, and to power source line VARY via transistor CSEQ.

Figure 15:
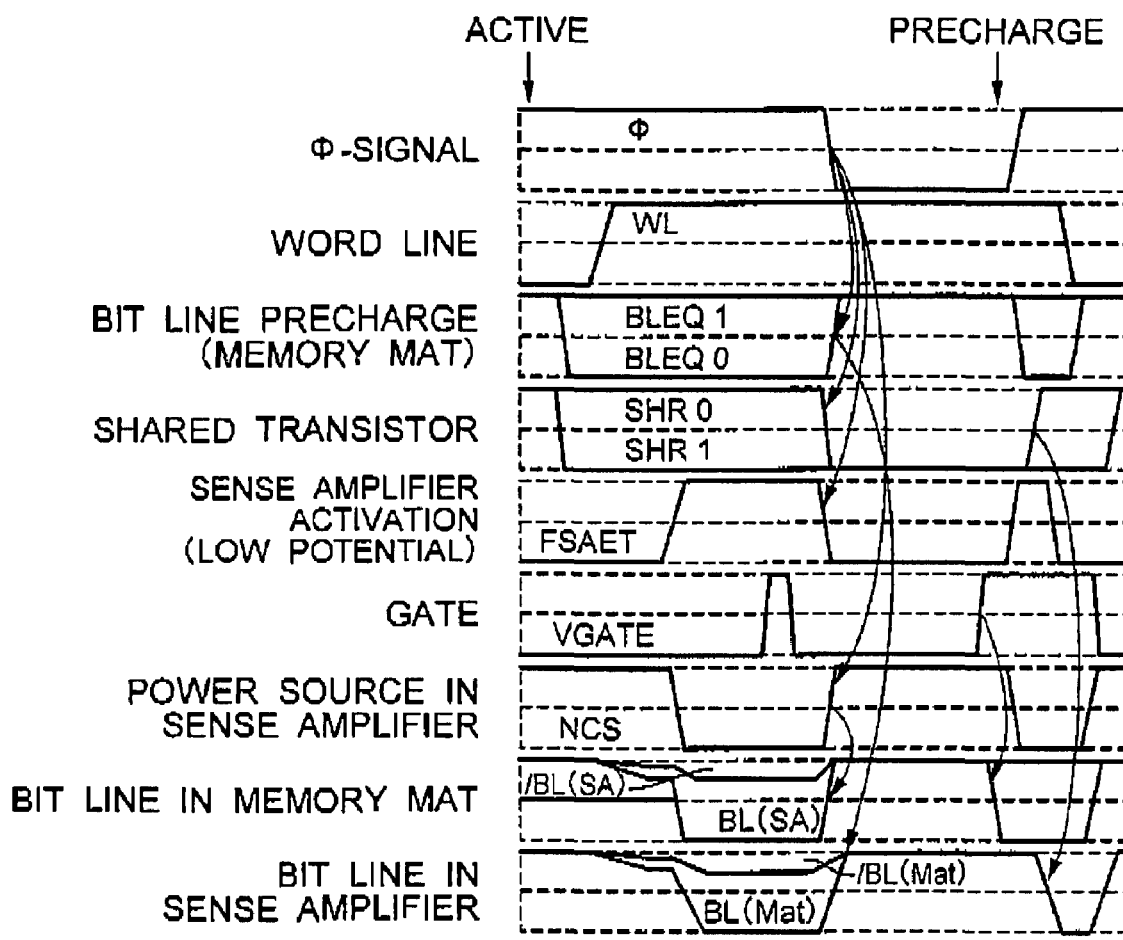
FIG. 15 is a waveform diagram showing operation of the semiconductor memory device of FIG. 14.
Figure 16:
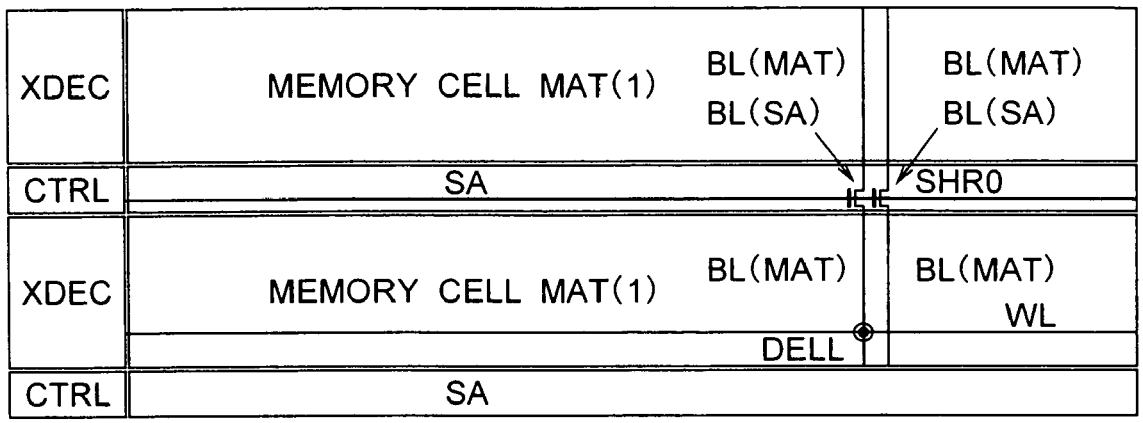
FIG. 16 is a partial block diagram of a related semiconductor memory device.

FIG. 15 shows a diagram of the waveform of each constituent element in the semiconductor memory device 100c. After the word line is activated, signal FSAET rises to a H-level to couple power source line NCS of the sense amplifier to power source line VSSSA. The sense amplifier lowers the potential of one of the bit lines BL and /BL having a lower potential to a VSSSA level via transistors N21 and N22. Since power source line PCS (FIG. 1) is not provided in the sense amplifier, the other of bit lines BL and /BL having a higher potential is not raised to a VARY level.

After the activation of sense amplifier, signal VGATE turns ON gate transistor NGATE in the flip-flop 106 to transfer the potential or data of the bit line pair to the flip-flop 106. Thereafter, the φ-signal is lowered to a L-level to tun OFF shared transistor SHR0, and the sense amplifier is inactivated, power source line NCS is coupled to power source line VARY, and the bit line pair in the sense amplifier is precharged to a VARY level. Signal BLEQ is raised to a H-level to precharge the bit line pair in the memory mat to a VARY level.

The flip-flop 106 holds the data received at a timing of the H-level of signal VGATE, by using four transistors P11, P12, N11, and N12. This data is delivered from the flip-flop 106 onto the I/O line pair to execute a read/write operation if a read/write command is issued to the command decoder (shown in FIG. 3), similarly to the third embodiment. The φ-signal generation circuit 113 returns the φ-signal to a H-level, if a precharge command is issued. Thus, transistor FSAET is turned ON to couple power source line NCS to power source line VSSSA, and the recharge of the bit line pair is terminated.

Signal VGATE is raised to a H-level and the data held by the flip-flop 106 is delivered onto the bit line pair in the sense amplifier. The time length during which signal VGATE assumes a H-level in the present embodiment is longer than the time length during which signal VGATE assumes a H-level in the third embodiment. This configuration is employed for the purpose of holding the potential of one of bit lines BL and /BL having a higher potential by using p-channel transistors P11 in FF106 (shown in FIG. 11). Thereafter, shared transistor SHR0 is turned ON and the data is returned to and stored in the memory cell via the bit line pair in the memory mat.

In the present embodiment, the flip-flop 106 is used for the read/write operation after the sense amplifier is inactivated. This affords an advantage similar to the advantage of the third embodiment. In addition, upon restoring of data in the memory cell, the potential of one of the bit lines having a higher potential is raised to a VARY (VFF) level by using p-channel transistors P11 and P12 in the flip-flop 106. This allows omission of p-channel transistors which raise the potential of one of the bit lines having a higher potential in the sense amplifier to a VARY level. Further, since the high-potential power source line PCS is unnecessary in the sense amplifier, transistor FSAPT for power source line PCS (FIG. 1) can be omitted.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor memory device comprising:
a memory cell array including a first bit line pair and a plurality of memory cells connecting to said first bit line pair, a selected one of said memory cells delivering data to or receiving data from said first bit line pair;
a sense amplifier including therein a second bit line pair and an amplifying element amplifying a potential difference between bit lines of said second bit line pair; and
a transfer gate for controlling coupling of said first bit line pair and said second bit line, wherein:

after said sense amplifier amplifies, upon selection of one of said memory cells by activating a corresponding word line of the semiconductor memory device, the potential difference between bit lines of said second bit line pair coupled to said first bit line pair by said transfer gate, said transfer gate isolates said second bit line pair from said first bit line pair while said corresponding word line remains activated, and said sense amplifier is inactivated.

2. The semiconductor memory device according to claim 1, wherein, upon completion of selection of said one of said memory cells, said transfer gate couples said second bit line pair to said first bit line pair, said sense amplifier is activated to amplify the potential difference between bit lines of said second bit line pair coupled to said first bit line pair, and store said amplified data to said one of said memory cells via said second bit line pair and said first bit line pair.

3. The semiconductor memory device according to claim 1, wherein if neither of read, write and precharge commands is issued within a specified time length after said sense amplifier is activated, said transfer gate isolates said second bit line pair from said first bit line pair, and said sense amplifier is inactivated.

4. The semiconductor memory device according to claim 1, wherein said second bit line pair is precharged to a specified potential level after said sense amplifier is inactivated.

5. The semiconductor memory device according to claim 4, wherein said specified potential level is half a potential of an internal power source provided in said memory cell array.

6. The semiconductor memory device according to claim 4, wherein said specified potential level is equal to a potential of an internal power source provided in said memory cell array.

7. The semiconductor memory device according to claim 1, wherein said first bit line pair holds data thereon after said inactivation of said sense amplifier.

8. The semiconductor memory device according to claim 7, wherein if any of read, write and precharge commands is issued after said inactivation of said sense amplifier, said transfer gate couples said second bit line pair to said first bit line pair, and said sense amplifier is again activated.

9. The semiconductor memory device according to claim 8, wherein if neither of read, write and precharge commands is issued within a specified time interval after said sense amplifier is again activated, said transfer gate insolates said second bit line pair from said first bit line pair, and said sense amplifier is again inactivated.

10. The semiconductor memory device according to claim 1, wherein after said sense amplifier is inactivated, the first bit line pair and the selected one of said memory cells maintain the potential difference between bit lines during the transfer gate being isolated.

11. The semiconductor memory device according to claim 1, further comprising a flip-flop for storing therein data held on said first or second bit line pair, wherein said flip-flop receives therein data held on said first or second bit line pair after completion of amplification by said sense amplifier, and said flip-flop delivers, upon completion of selection of said one of said memory cells, stored data into said one of said memory cells via at least said first bit line pair.

12. The semiconductor memory device according to claim 11, wherein the flip-flop is arranged between the transfer gate and the sense amplifier.

13. A semiconductor memory device comprising:
a memory cell array including a first bit line pair and a plurality of memory cells connecting to said first bit line pair, a selected one of said memory cells delivering data to or receiving data from said first bit line pair;

a sense amplifier including therein a second bit line pair and an amplifying element amplifying a potential difference between bit lines of said second bit line pair;

a transfer gate for controlling coupling of said first bit line pair and said second bit line, wherein:

after said sense amplifier amplifies, upon selection of one of said memory cells, the potential difference between bit lines of said second bit line pair coupled to said first bit line pair by said transfer gate, said transfer gate isolates said second bit line pair from said first bit line pair, and said sense amplifier is inactivated; and a flip-flop for storing therein data held on said first or second bit line pair, wherein said flip-flop receives therein data held on said first or second bit line pair after completion of amplification by said sense amplifier, and said flip-flop delivers, upon completion of selection of said one of said memory cells, stored data into said one of said memory cells via at least said first bit line pair.

14. The semiconductor memory device according to claim 13, wherein a read/write command is issued with respect to data stored in said flip-flop.

15. The semiconductor memory device according to claim 13, wherein said sense amplifier is inactivated within a time interval between receipt of data in said flipflop and delivering of stored data from said flip-flop.

16. The semiconductor memory device according to claim 13, wherein said flip-flop includes two p-channel transistors and two n-channel transistors, each of said two p-channel transistors includes a source connected to a high-potential power source line, a drain connected to one of bit lines of said first or second bit line pair via a gate transistor, and a gate connected to said drain of the other of said two p-channel transistors, and one of said two n-channel transmission corresponding to said each of said p-channel transistor includes a source connected to a low-potential power source line, a drain connected to one of bit lines of said first or second bit line pair via said gate transistor, and a gate connected to said drain of the other of said two n-channel transistors.

17. The semiconductor memory device according to claim 16, wherein said sense amplifier includes two n-channel transistors, each of which includes a source connected to a low-potential power source line, a drain connected to one of bit lines of said first or second bit line pair, and a gate connected to said drain of the other of said two n-channel transistors.

18. The semiconductor memory device according to claim 17, wherein upon inactive state of said sense amplifier, said second bit line pair is precharged to a potential of an internal power source line in said memory cell array, and delivering of stored data from said flip-flop is performed by lowering a potential of one of said bit lines having a L-level data by using one of said two n-channel transistors in said sense amplifier and by maintaining a potential of the other of said bit lines having a H-level data at said potential of said internal power source line by using one of said two p-channel transistors in said flip-flop.

19. A method of operating a semiconductor memory device comprising a memory cell array including a first bit line pair and a plurality of memory cells connecting to said first bit line pair, a selected one of said memory cells delivering data to or receiving data from said first bit line pair; a sense amplifier including therein a second bit line pair and an amplifying element amplifying a potential difference between bit lines of said second bit line pair; and a transfer gate for controlling coupling of said first bit line pair and said second bit line, the method comprising:

amplifying via said sense amplifier, upon selection of one of said memory cells by activating a respective word line of the semiconductor memory device, the potential difference between bit lines of said second bit line pair coupled to said first bit line pair by said transfer gate; and after said amplifying via said sense amplifier, isolating, via said transfer gate, said second bit line pair from said first bit line pair while said respective word line remains activated, and said sense amplifier is inactivated.

20. The method according to claim 19, wherein if neither of read, write and precharge commands is issued within a specified time length after said sense amplifier is activated, isolating, via said transfer gate, said second bit line pair from said first bit line pair, and said sense amplifier is inactivated.

21. The method according to claim 19, further comprising precharging said second bit line pair to a specified potential level after said sense amplifier is inactivated.

22. The method according to claim 21, wherein said specified potential level is half a potential of an internal power source provided in said memory cell array.

23. The method according to claim 21, wherein said specified potential level is equal to a potential of an internal power source provided in said memory cell array.

* * * * *